United States Patent
Melanson et al.

(10) Patent No.: US 11,777,516 B2
(45) Date of Patent: Oct. 3, 2023

(54) SIGMA-DELTA MODULATOR WITH RESIDUE CONVERTER FOR LOW-OFFSET MEASUREMENT SYSTEM

(71) Applicant: Cirrus Logic International Semiconductor Ltd., Edinburgh (GB)

(72) Inventors: John L. Melanson, Austin, TX (US); Axel Thomsen, Austin, TX (US); Mucahit Kozak, Austin, TX (US); Paul Wilson, Linlithgow (GB); Eric J. King, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/667,953

(22) Filed: Feb. 9, 2022

(65) Prior Publication Data
US 2022/0263519 A1    Aug. 18, 2022

Related U.S. Application Data

(63) Continuation-in-part of application No. 17/232,949, filed on Apr. 16, 2021.

(60) Provisional application No. 63/148,832, filed on Feb. 12, 2021.

(51) Int. Cl.
*H03M 3/00* (2006.01)

(52) U.S. Cl.
CPC .......... *H03M 3/344* (2013.01); *H03M 3/422* (2013.01)

(58) Field of Classification Search
CPC ........ H03M 3/344; H03M 3/422; H03M 3/34; H03M 3/414
USPC ......................................... 341/143
See application file for complete search history.

(56) References Cited

U.S. PATENT DOCUMENTS

| | | | |
|---|---|---|---|
| 9,438,261 B2 | 9/2016 | Garcia Gonzalez et al. | |
| 2011/0063146 A1 | 3/2011 | Matthews et al. | |
| 2015/0381198 A1* | 12/2015 | Lasseuguette | H03M 3/496 |
| | | | 341/143 |

(Continued)

FOREIGN PATENT DOCUMENTS

EP    1705493 B1    11/2008

OTHER PUBLICATIONS

International Search Report and Written Opinion of the International Searching Authority, International Application No. PCT/US2022/015477, dated May 9, 2022.

(Continued)

*Primary Examiner* — Jean B Jeanglaude
(74) *Attorney, Agent, or Firm* — Jackson Walker L.L.P

(57) ABSTRACT

A signal processing system may include a sensor readout channel configured to convert an electronic signal into a digital quantity. The sensor readout channel may include a first-order sigma-delta modulator having a modulator input and a modulator output, first outside chopping switches located at the modulator input, second outside chopping switches located at the modulator output, an auxiliary path having an analog-to-digital converter (ADC) having an auxiliary path input and an auxiliary path output, the auxiliary path input configured to receive as its input signal a signal output by a memory element of the first-order sigma-delta modulator, and a signal combiner configured to combine a modulator output signal generated by the first-order sigma-delta modulator with an auxiliary path output signal generated by the auxiliary path to generate a combined output signal.

30 Claims, 9 Drawing Sheets

(56) References Cited

U.S. PATENT DOCUMENTS

| | | | |
|---|---|---|---|
| 2016/0182081 A1* | 6/2016 | Perrott | H03M 3/464 |
| | | | 341/143 |
| 2018/0247522 A1* | 8/2018 | Motz | G08C 15/02 |
| 2019/0253069 A1* | 8/2019 | Kim | H03F 3/45215 |

OTHER PUBLICATIONS

International Search Report and Written Opinion of the International Searching Authority, International Application No. PCT/US2022/015827, dated May 30, 2022.

Fraisse, Christian et al.: "A [Sigma] [Delta] sense chain using chopped integrators for ultra-low-noise MEMS system," ESSCIRC Conference 2016: 42 European Sold-State Circuits Conference, IEEE, Sep. 12, 2016, pp. 153-156.

Van Vroonhoven, Caspar, A 0-to-60V-Input Vcm Coulomb Counter with Signal-Dependent Supply Current and ±0.5% Gain Inaccuracy from −50° C. to 125° C., 2020 IEEE International Solid-State Circuits Conference, Feb. 19, 2020.

* cited by examiner

SIGMA-DELTA MODULATOR WITH RESIDUE CONVERTER FOR LOW-OFFSET MEASUREMENT SYSTEM

RELATED APPLICATIONS

This application claims priority to U.S. Provisional Patent Application Ser. No. 63/148,832, filed Feb. 12, 2021, and claims priority as a continuation-in-part to U.S. patent application Ser. No. 17/232,949 filed Apr. 16, 2021, both of which are incorporated by reference herein in their entireties.

FIELD OF DISCLOSURE

The present disclosure relates in general to circuits for electronic devices, including without limitation personal portable devices such as wireless telephones and media players, and more specifically, to a system having a sigma-delta modulator and an auxiliary path parallel to the sigma-delta modulator in order to minimize measurement offset.

BACKGROUND

Portable electronic devices, including wireless telephones, such as mobile/cellular telephones, tablets, cordless telephones, mp3 players, and other consumer devices, are in widespread use. Such portable electronic devices are often powered by a battery (e.g., a lithium-ion battery). In battery-powered devices, it is often desirable to measure an amount of electrical charge drawn from a battery and delivered to the battery, which may be used to determine a state of charge of the battery.

A circuit referred to as a coulomb counter may be used to measure an amount of electrical charge drawn from a battery and delivered to the battery. In operation, a coulomb counter may detect an electrical current flowing in and out of the battery and integrate such current continuously over time, in order to calculate a total electrical charge drawn from and delivered to the battery. Because coulomb counters continuously integrate, extremely low direct-current (DC) offset in coulomb counter circuitry is desired.

FIG. 1 illustrates a block diagram of an example coulomb counter, as is known in the art. As shown in FIG. 1, a coulomb counter 1 may include a sense resistor 2 for measuring a sense voltage $V_{SNS}$ which is indicative of an electrical current $I_{SNS}$ flowing through the sense resistor. For example, electrical current $I_{SNS}$ may comprise a current drawn from a battery. As also shown in FIG. 1, coulomb counter 1 may include an integrator 4 implemented in part with an amplifier 6, such integrator 4 configured to integrate electrical current $I_{SNS}$ over time, providing an indication of net electrical charge that has flowed through sense resistor 2. Thus, if sense resistor 2 is coupled to the output of a battery, coulomb counter 1 may calculate a net electrical charge drawn from the battery.

As also shown in FIG. 1, coulomb counter 1 may implement both system-level chopping using chopping blocks 8 and block-level chopping within integrator 4, using chopping blocks 10. Block-level chopping blocks 10 may operate at a first chopping frequency (e.g., one-half the sampling frequency $f_s$ of coulomb counter 1) to reduce DC offset and inverse frequency noise (also known as 1/f noise) of amplifier 6, and system-level chopping blocks 8 may operate at a second chopping frequency (e.g., $f_s/512$) to further minimize the residual DC offset for coulomb counter 1.

For better clarity, coulomb counter 1 depicted in FIG. 1 may be represented as a signal processing block diagram as shown in FIG. 2. As shown in FIG. 2, system-level chopping blocks 8 are represented as mixers 12, each having a chopping frequency $f_{chsys}$, at the input and output of a sigma-delta analog to digital converter (ADC) 14 that comprises integrator 4 and a three-level quantizer 16. Block-level chopping blocks 10 are not depicted in FIG. 2.

Coulomb counter 1 as depicted in FIGS. 1 and 2 employs first-order sigma-delta modulation. A disadvantage of such approach is that the minimum charge resolution using first-order sigma-delta modulation may be limited to higher than that which may be desirable.

SUMMARY

In accordance with the teachings of the present disclosure, certain disadvantages and problems associated with existing sensor systems may be reduced or eliminated.

In accordance with embodiments of the present disclosure, a signal processing system may include a sensor readout channel configured to convert an electronic signal into a digital quantity. The sensor readout channel may include a first-order sigma-delta modulator having a modulator input and a modulator output, first outside chopping switches located at the modulator input, second outside chopping switches located at the modulator output, an auxiliary path comprising an analog-to-digital converter (ADC) having an auxiliary path input and an auxiliary path output, the auxiliary path input configured to receive as its input signal a signal output by a memory element of the first-order sigma-delta modulator, and a signal combiner configured to combine a modulator output signal generated by the first-order sigma-delta modulator with an auxiliary path output signal generated by the auxiliary path to generate a combined output signal.

In accordance with embodiments of the present disclosure, a method may include, in a system comprising a sensor readout channel configured to convert an electronic signal into a digital quantity, the sensor readout channel comprising a first-order sigma-delta modulator having a modulator input and a modulator output: switching first outside chopping switches located at the modulator input and second outside chopping switches located at the modulator output in synchronization, receiving, by an auxiliary path comprising an analog-to-digital converter (ADC) having an auxiliary path input and an auxiliary path output, as its input signal a signal output by a memory element of the first-order sigma-delta modulator; and combining a modulator output signal generated by the first-order sigma-delta modulator with an auxiliary path output signal generated by the auxiliary path to generate a combined output signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
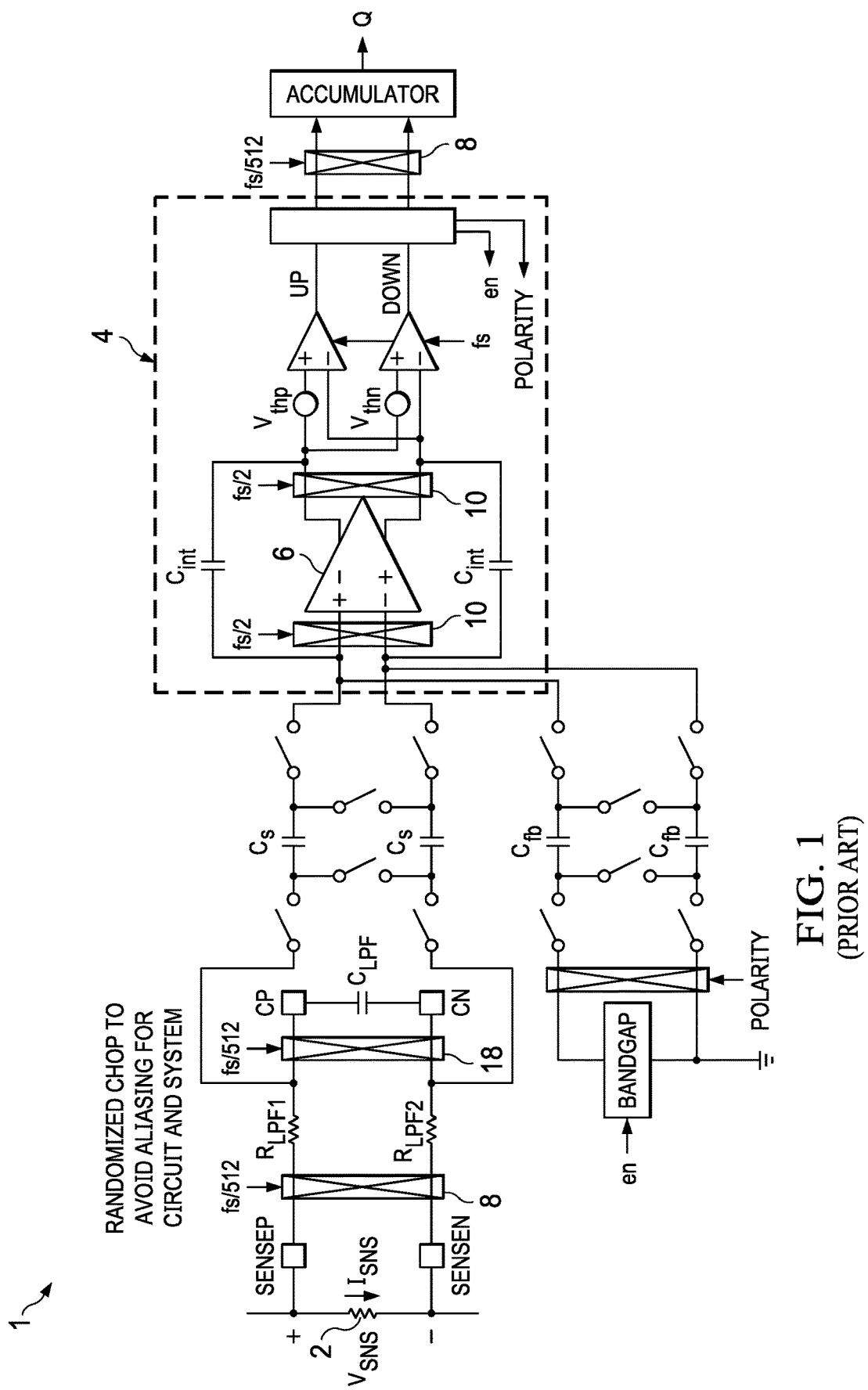
FIG. 1 illustrates a circuit diagram of selected components of a coulomb counter, as is known in the art.
Figure 2:
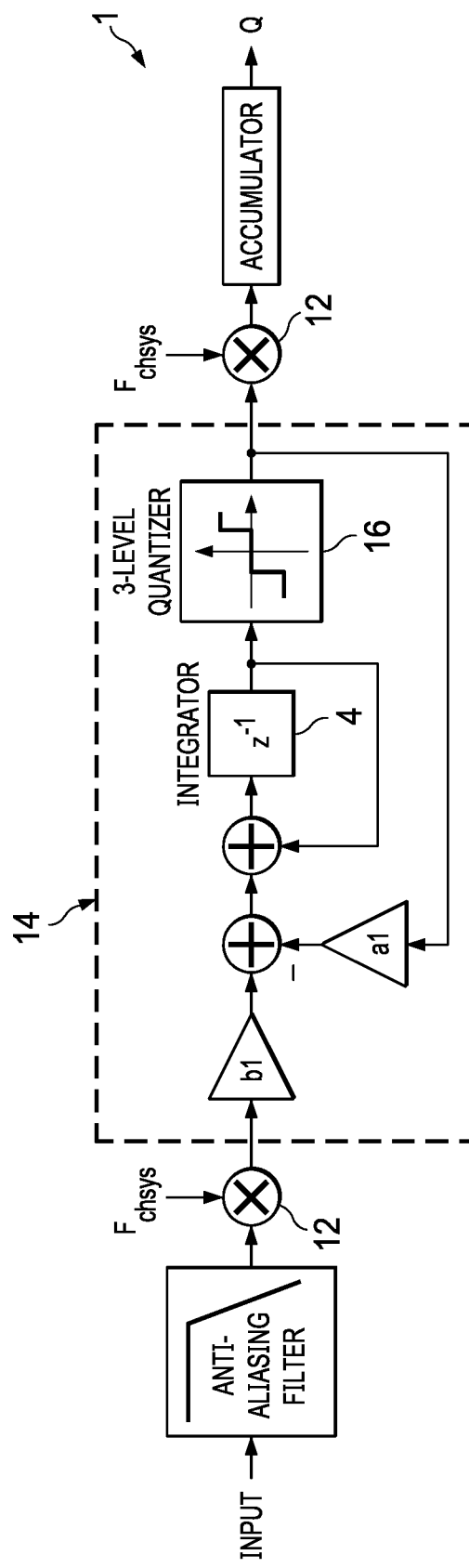
FIG. 2 illustrates a block diagram of the coulomb counter of FIG. 1, as is known in the art.
Figure 3:
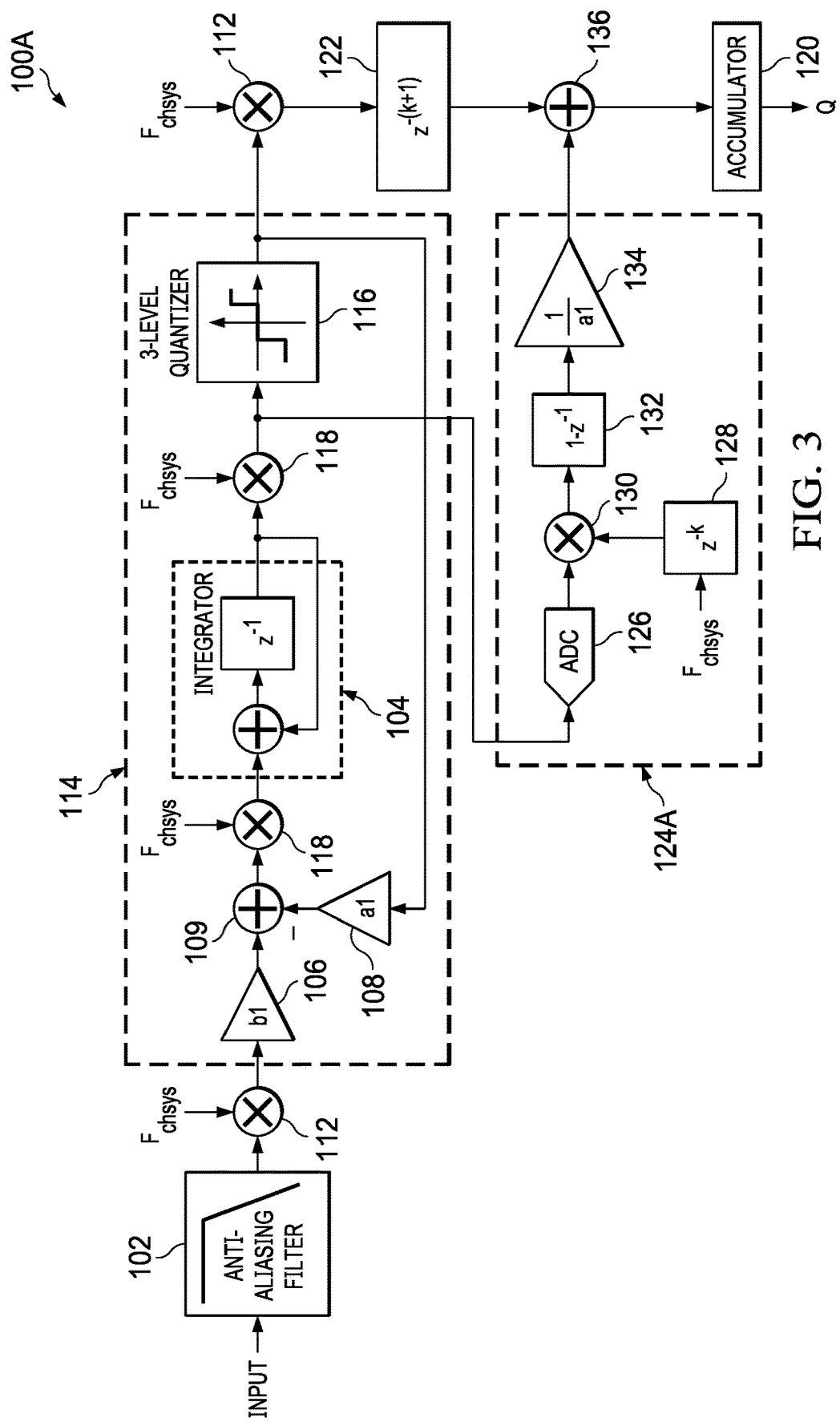
FIG. 3 illustrates a block diagram of an example coulomb counter, in accordance with embodiments of the present disclosure.

FIG. 3 illustrates a block diagram of an example coulomb counter 100A, in accordance with embodiments of the present disclosure. In some embodiments, coulomb counter 100A may be implemented within a portable electronic device, such as a smart phone, tablet, game controller, and/or other suitable device. As shown in FIG. 3, coulomb counter 100A may include an anti-aliasing filter 102, outside system-level chopping mixers 112, sigma-delta ADC 114, a delay element 122, an auxiliary path 124A, a combiner 136, and an accumulator 120.

Anti-aliasing filter 102 may be located at the input of coulomb counter 100A and may be configured to filter an input signal to coulomb counter 100A indicative of an electrical current (e.g., a sensed voltage across a sense resistor). Outside system-level chopping mixers 112 may be located at an input and output of sigma-delta ADC 114 to perform signal chopping at a system-level chopping frequency $F_{chsys}$.

Sigma-delta ADC 114 may comprise any suitable system, device, or apparatus configured to convert an analog signal received at its input to an equivalent digital signal at its output. As shown in FIG. 3, sigma-delta ADC 114 may be implemented using a gain element 106, a gain element 108, combiner 109, integrator 104, a three-level quantizer 116, and two inside system-level chopping mixers 118.

Gain element 106 may comprise any suitable system, device, or apparatus configured to apply a gain b1 (which may be less than, greater than, or equal to 1) to a signal received at the input of sigma-delta ADC 114. Similarly, gain element 108 may comprise any suitable system, device, or apparatus configured to apply a gain a1 (which may be less than, greater than, or equal to 1) to a signal generated at the output of sigma-delta ADC 114.

Combiner 109 may generate an error signal equal to a difference between the input signal to sigma-delta ADC 114 as modified by gain element 106 and the output signal of sigma-delta ADC 114 as modified by gain element 108. Such error signal may be operated upon by integrator 104 and three-level quantizer 116 to generate a quantized digital output signal for sigma-delta ADC 114.

Inside system-level chopping mixers 118 may be located internally to sigma-delta ADC 114 at an input and output of integrator 104 to perform signal chopping at a system-level chopping frequency $F_{chsys}$. Such inside system-level chopping mixers 118 may serve to preserve quantization error within coulomb counter 100A, even when system-level chopping is activated, for example as described in U.S. patent application Ser. No. 17/232,949.

Delay element 122 may add a delay response $z^{-(k+1)}$ to the output of sigma-delta ADC 114 in order to balance the signal propagation delay of sigma-delta ADC 114 with that of auxiliary path 124A. The value k may represent a path delay of an auxiliary ADC 126 present in auxiliary path 124A.

As shown in FIG. 3, auxiliary path 124A may be implemented with auxiliary ADC 126, delay element 128, auxiliary system-level chopping mixer 130, digital differentiator 132, and gain element 134. Auxiliary ADC 126 may be configured to convert an analog signal present at the output of integrator 104 (as processed by a system-level chopping mixer 118) to an equivalent digital signal. The output of auxiliary ADC 126 may be processed by an auxiliary system-level chopping mixer 130 having functionality similar to the outside system-level chopping mixer 112 that processes the output of sigma-delta ADC 114. Auxiliary system-level chopping mixer 130 may perform signal chopping at a system-level chopping frequency $F_{chsys}$, as delayed by delay element 128 having a delay response $z^{-k}$. Digital differentiator 132 may apply a response $1-z^{-1}$ to the output of auxiliary system-level chopping mixer 130. Gain element 134 may comprise any suitable system, device, or apparatus configured to apply a gain 1/a1 (which may be less than, greater than, or equal to 1) to a signal generated at the output of digital differentiator 132.

Combiner 136 may combine the signals output by delay element 122 and auxiliary path 124A in order to generate a combined digital output signal. Accumulator 120 may receive the combined digital output signal and digitally integrate the quantized digital output signal over time to calculate an accumulated output signal indicative of a net amount of charge Q flowing through the sense resistor from which the input of coulomb counter 100A is obtained.

Figure 4:
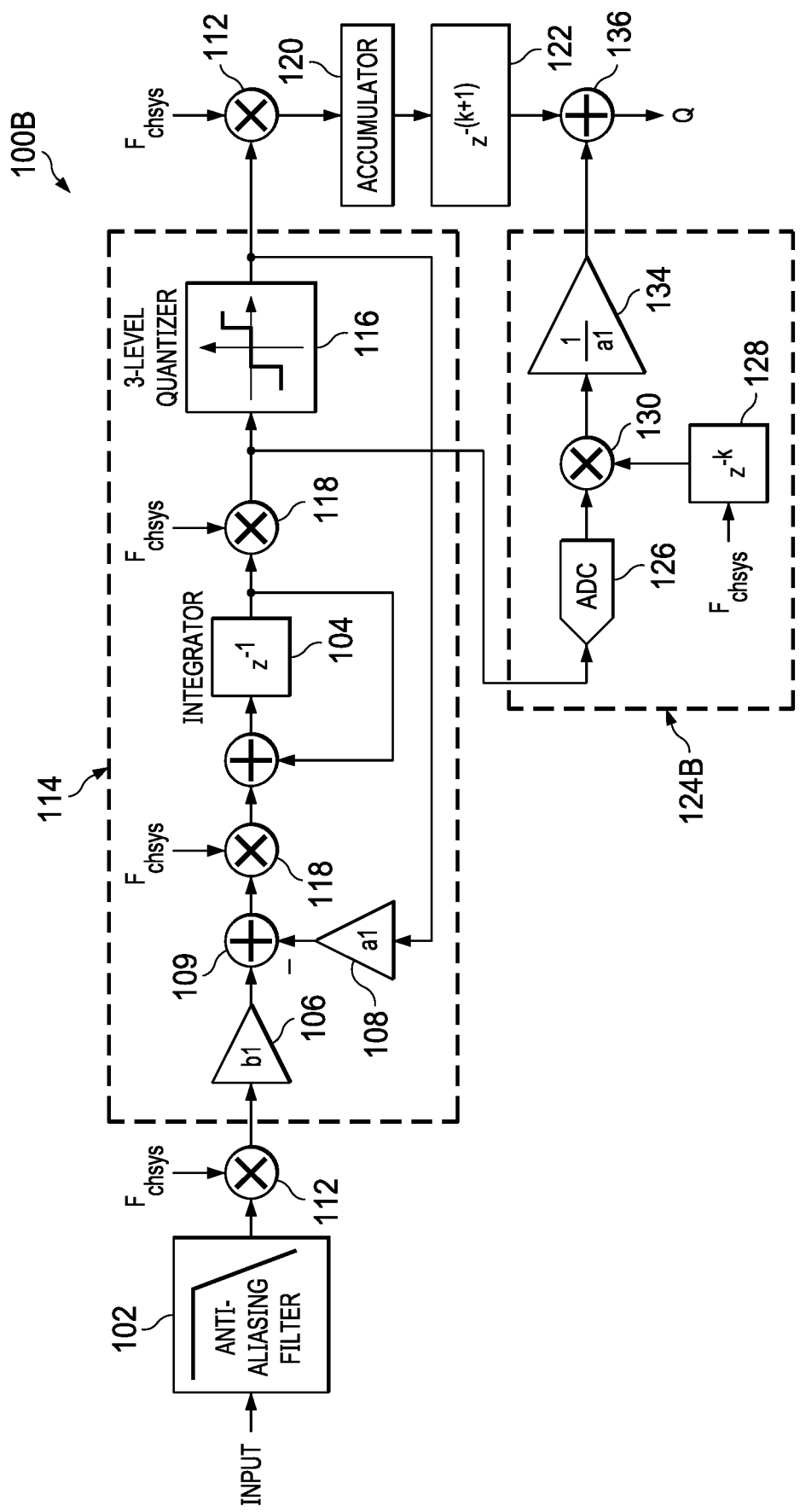
FIG. 4 illustrates a block diagram of another example coulomb counter, in accordance with embodiments of the present disclosure.

FIG. 4 illustrates a block diagram of an example coulomb counter 100B, in accordance with embodiments of the present disclosure. In some embodiments, coulomb counter 100B may be implemented within a portable electronic device, such as a smart phone, tablet, game controller, and/or other suitable device. Coulomb counter 100B depicted in FIG. 4 may be similar in many respects to coulomb counter 100A depicted in FIG. 3. Accordingly, only certain differences between coulomb counter 100B and coulomb counter 100A may be described below.

For example, coulomb counter 100B may include auxiliary path 124B in lieu of auxiliary path 124A. In coulomb counter 100B, accumulator 120 and digital differentiator 132 may cancel each other out, and the output of auxiliary path 124B may not require an accumulated charge register or a digital accumulator and differentiator. Accordingly, auxiliary path 124B may be simplified as compared to auxiliary path 124A, and auxiliary path 124B may include auxiliary ADC 126, auxiliary system-level chopping mixer 130 operating at system-level chopping frequency $F_{chsys}$ (as delayed by delay element 128 having a delay response $z^{-k}$) for processing the output of auxiliary ADC 126, and gain element 134 configured to apply a gain 1/a1 (which may be less than, greater than, or equal to 1) to the output of auxiliary system-level chopping mixer 130.

Further, the output of sigma-delta ADC 114 may be processed differently in coulomb counter 100B as compared to coulomb counter 100A. For example, as shown in FIG. 4, accumulator 120 may accumulate a quantized digital signal output by sigma-delta ADC 114 (as processed by an outside system-level chopping mixer 112), and delay element 122 may be applied to the accumulated digital output of accumulator 120. Combiner 136 may combine the output of delay element 122 with the output of auxiliary path 124B to generate an accumulated output signal indicative of a net amount of charge Q flowing through the sense resistor from which the input of coulomb counter 100B is obtained.

In some embodiments, auxiliary path 124B may be configured such that it is only enabled upon a readout request for the accumulated output signal, in order to minimize power consumption.

Figure 5:
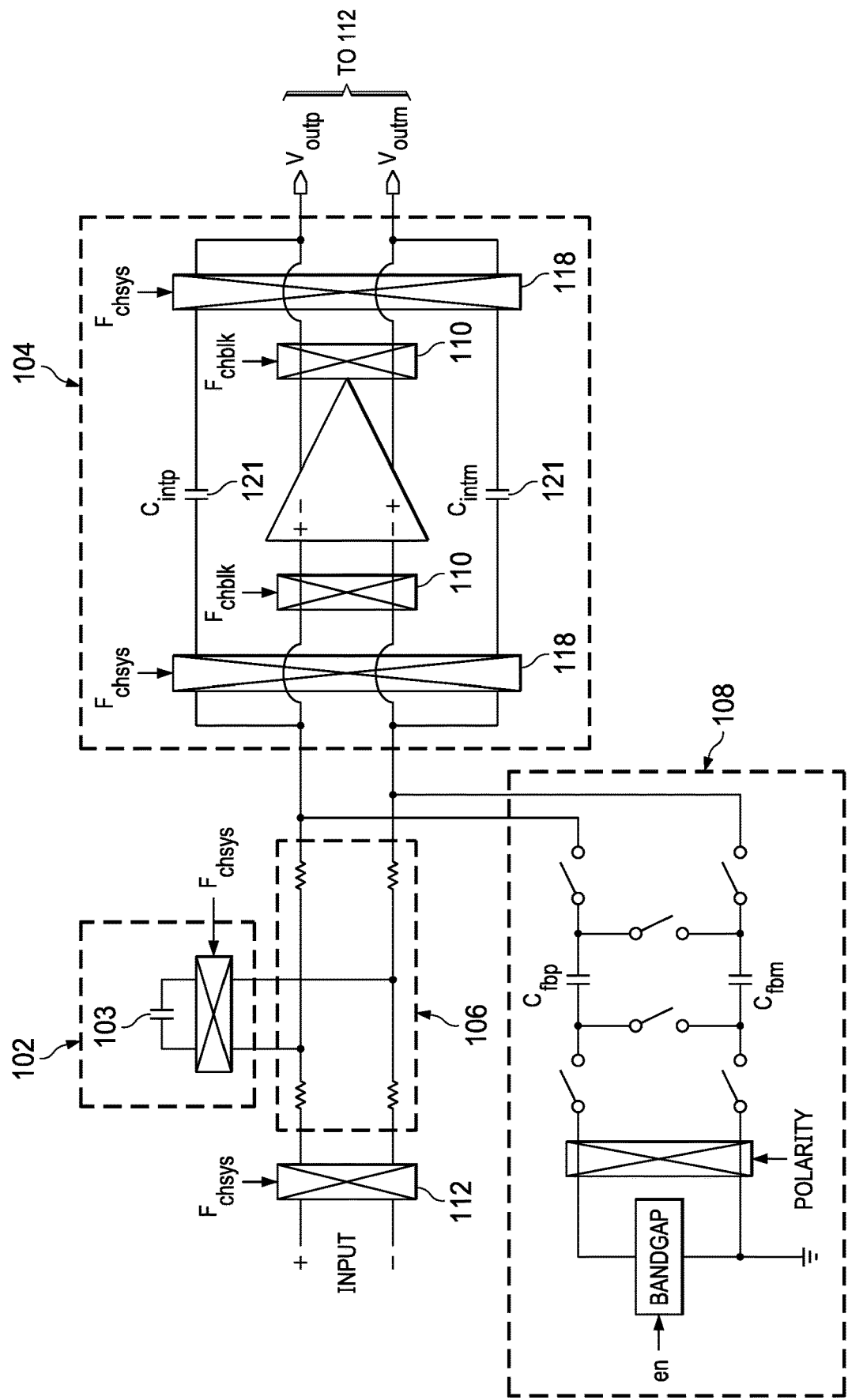
FIG. 5 illustrates a circuit diagram of selected components of an anti-aliasing filter and sigma-delta ADC used in the coulomb counter of FIG. 4, in accordance with embodiments of the present disclosure.

FIG. 5 illustrates a circuit diagram of selected components of anti-aliasing filter 102 and sigma-delta ADC 114, showing detailed implementation of gain element 106, gain element 108, and integrator 104 in a continuous-time implementation of coulomb counter 100B, in accordance with embodiments of the present disclosure. As shown in FIG. 5, inside system-level chopping mixers 118 may be implemented as a set of switches at the input and output of integrator 104, wherein such set of switches may swap integrating capacitors 121 of integrator 104 every time the input signal to sigma-delta ADC 114 changes polarity due to the outside system-level chopping mixer 118 at the input of sigma-delta ADC 114. Further, in the topology shown in FIG. 5, a capacitor 103 of anti-aliasing filter 102 is not chopped. In addition, gain element 108 may be implemented as a 1.5-bit switch-capacitor feedback digital-to-analog converter.

Figure 6:
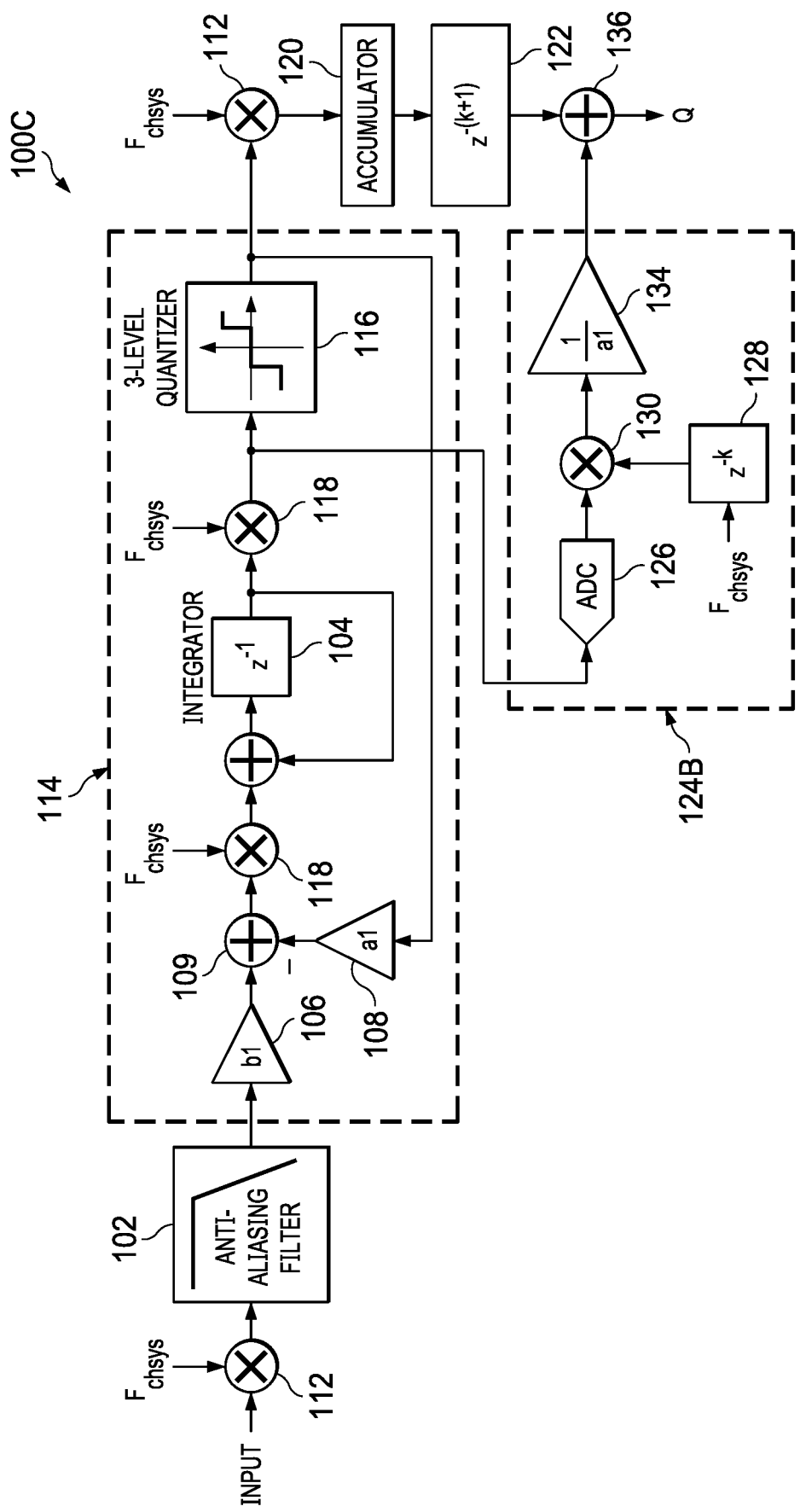
FIG. 6 illustrates a block diagram of another example coulomb counter, in accordance with embodiments of the present disclosure.

FIG. 6 illustrates a block diagram of an example coulomb counter 100C, in accordance with embodiments of the present disclosure. In some embodiments, coulomb counter 100C may be implemented within a portable electronic device, such as a smart phone, tablet, game controller, and/or other suitable device. Coulomb counter 100C depicted in FIG. 6 may be similar in many respects to coulomb counter 100B depicted in FIG. 4, except that system-level chopping is also applied to anti-aliasing filter 102, and thus an outside system-level chopping mixer 112 may be placed at the input of anti-aliasing filter 102 in coulomb counter 100C, in lieu of the outside system-level chopping mixer 112 placed at the output of anti-aliasing filter 102 in coulomb counter 100B. In the architecture of coulomb counter 100C, auxiliary ADC 126 may provide a correction path to compensate for the delay between the chopping and unchopping mixers. Applying system-level chopping to anti-aliasing filter 102 may also minimize DC offset compared to the architecture of coulomb counter 100B.

Figure 7:
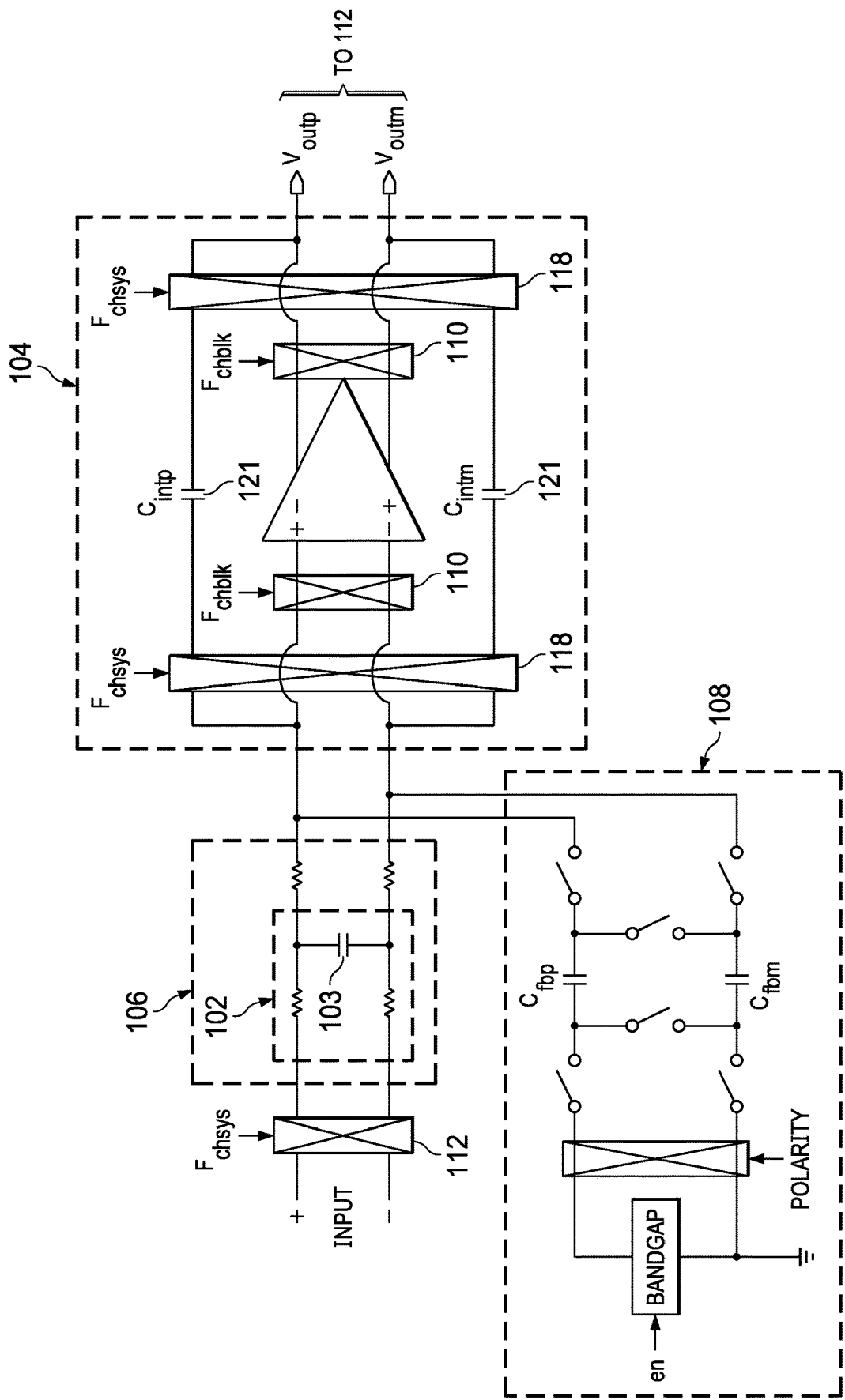
FIG. 7 illustrates a circuit diagram of selected components of an anti-aliasing filter and sigma-delta ADC used in the coulomb counter of FIG. 6, in accordance with embodiments of the present disclosure.

FIG. 7 illustrates a circuit diagram of selected components of anti-aliasing filter 102 and sigma-delta ADC 114, showing detailed implementation of gain element 106, gain element 108, and integrator 104 in a continuous-time implementation of coulomb counter 100C, in accordance with embodiments of the present disclosure. As shown in FIG. 7, capacitor 103 of anti-aliasing filter 102 is chopped.

Figure 8:
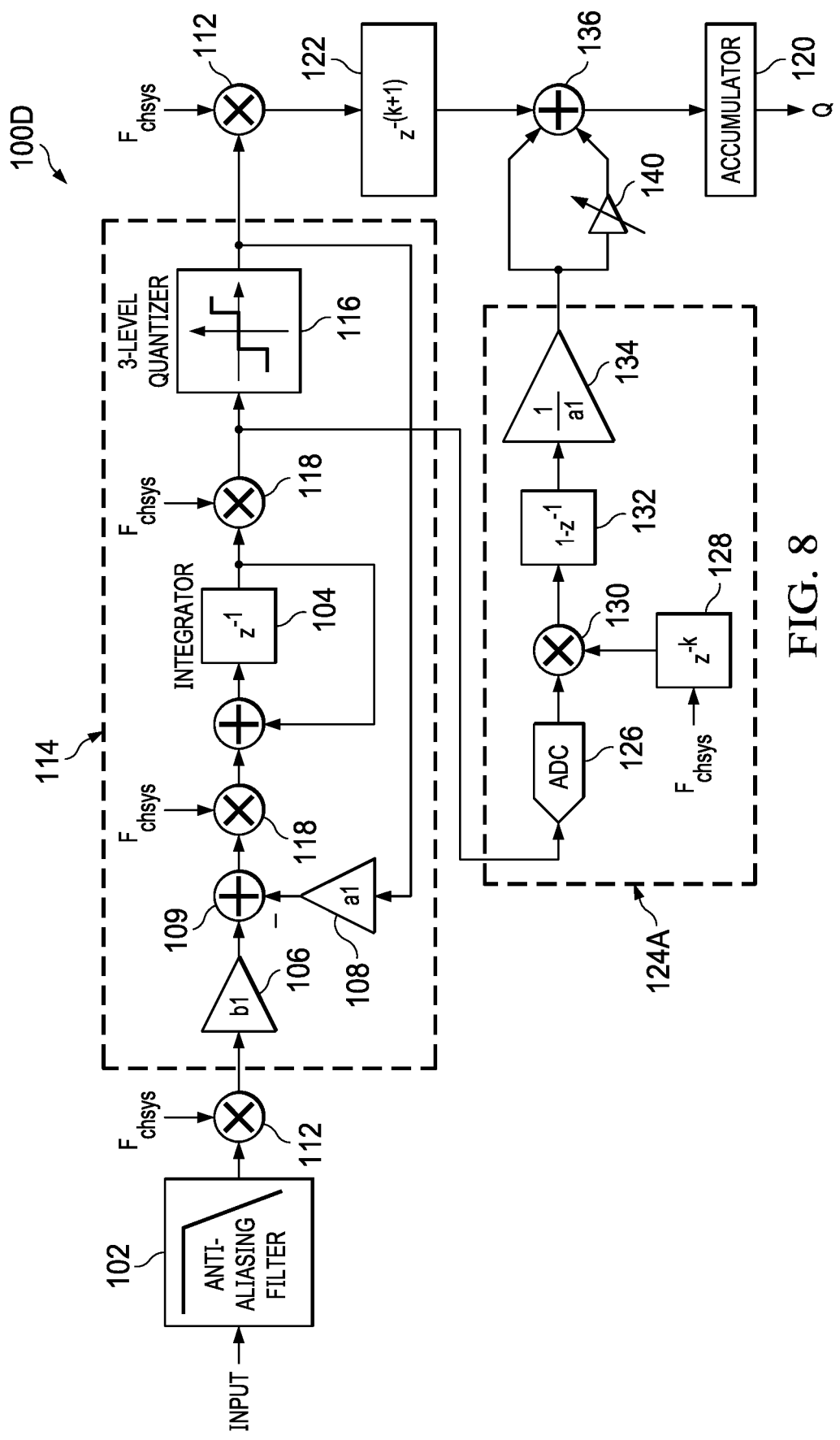
FIG. 8 illustrates a block diagram of another example coulomb counter, in accordance with embodiments of the present disclosure.

FIG. 8 illustrates a block diagram of an example coulomb counter 100D, in accordance with embodiments of the present disclosure. In some embodiments, coulomb counter 100D may be implemented within a portable electronic device, such as a smart phone, tablet, game controller, and/or other suitable device. Coulomb counter 100D depicted in FIG. 8 may be similar in many respects to coulomb counter 100A depicted in FIG. 3, except that coulomb counter 100D may include an adaptive gain element 140, having an adaptive gain responsive to the output of auxiliary ADC 126. As shown in FIG. 8, adaptive gain element 140 may be applied to the output of gain element 134 and combiner 136 may sum the outputs of gain element 134 and adaptive gain element 140. The adaptive gain of adaptive gain element 140 may be derived from a least-mean square algorithm or any other suitable optimization algorithm. In operation, adaptive gain element 140 may serve to minimize the signal-to-noise degradation due to non-idealities of analog components, such as finite amplifier gain and capacitor mismatch, for example. Accordingly, adaptive gain element 140 may enable "blind" digital correction, without requiring a pilot tone for performing such correction.

Figure 9:
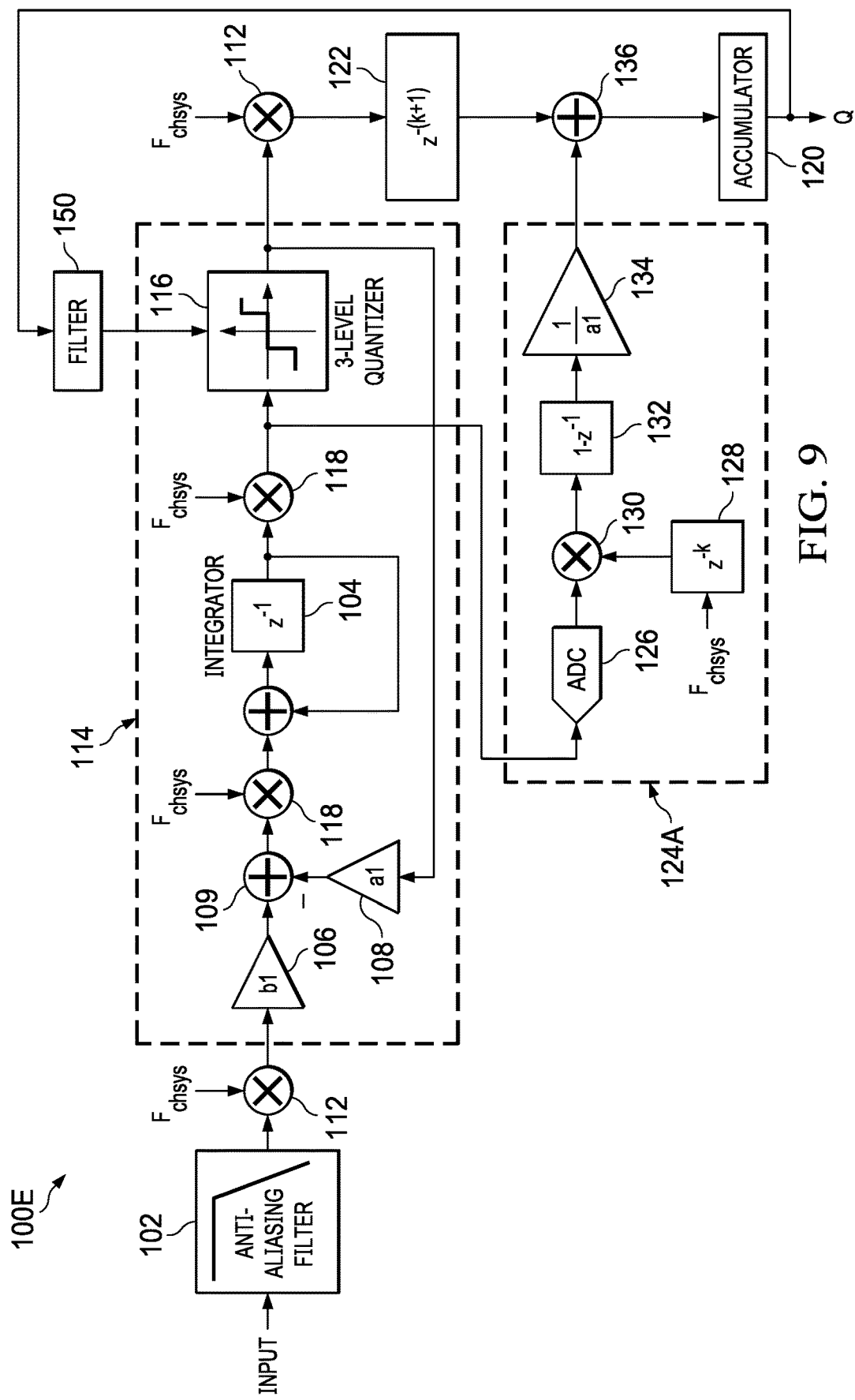
FIG. 9 illustrates a block diagram of another example coulomb counter, in accordance with embodiments of the present disclosure.

FIG. 9 illustrates a block diagram of an example coulomb counter 100E, in accordance with embodiments of the present disclosure. In some embodiments, coulomb counter 100E may be implemented within a portable electronic device, such as a smart phone, tablet, game controller, and/or other suitable device. Coulomb counter 100E depicted in FIG. 9 may be similar in many respects to coulomb counter 100A depicted in FIG. 3, except that in coulomb counter 100E, 3-level quantizer 116 may be configured to detect the accumulated output signal (as filtered by a feedback filter 150, which may comprise a low-pass filter), to determine a threshold mismatch of 3-level quantizer 116 by using pilot signals injected into the input of coulomb counter 100E during production test, allowing for production calibration to adjust threshold levels of 3-level quantizer 116 in order to "center" 3-level quantizer 116.

Although the foregoing discussion contemplates system-level chopping in a coulomb counter circuit, it is understood that the system-level chopping techniques disclosed above may apply to any sensor readout channel including a sigma-delta ADC wherein the sensor readout channel employs outside system-level chopping switches at the input and output of the sigma-delta ADC. It is understood that any such sensor readout channel may include memory elements (e.g., capacitors) used to implement an integrator inside the sigma-delta ADC which may be swapped periodically using inside system-level chopping switches in synchronization with the outside system-level chopping switches.

Although the foregoing contemplates sensing paths with two chopping operations within the path, it is understood that the foregoing dynamic chopping techniques could be applied to a sensing path or other signal path with a single chopping operation, or multiple chopping operations.

Further, although the foregoing contemplates use of system-level chopping techniques with a sigma-delta ADC, the systems and methods herein may be applied to any ADC having a memory element, whether such memory element includes an integrator or some other memory element.

Further, although the foregoing contemplates use of system-level chopping techniques with a first-order ADC having a single integrator, it is understood that such techniques may be used with higher-order ADCs including additional integrators or memory elements, in which case each memory element (each integrator or other memory element) may have inside system-level chopping mixers 118 at the respective input and output of such memory element.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A signal processing system comprising:
a sensor readout channel configured to convert an electronic signal into a digital quantity, the sensor readout channel comprising:
a first-order sigma-delta modulator having a modulator input and a modulator output;
first outside chopping switches located at the modulator input;
second outside chopping switches located at the modulator output;
an auxiliary path comprising an analog-to-digital converter (ADC) having an auxiliary path input and an auxiliary path output, the auxiliary path input configured to receive as its input signal a signal output by a memory element of the first-order sigma-delta modulator; and
a signal combiner configured to combine a modulator output signal generated by the first-order sigma-delta modulator with an auxiliary path output signal generated by the auxiliary path to generate a combined output signal.

2. The signal processing system of claim 1, wherein the memory element comprises an integrator.

3. The signal processing system of claim 1, further comprising an impedance for converting a sensed physical quantity into the electronic signal.

4. The signal processing system of claim 3, wherein:
the electronic signal is a voltage; and
the impedance is a resistor configured to convert an electrical current into the voltage.

5. The signal processing system of claim 4, wherein the sensor readout channel further comprises a digital accumulator configured to digitally integrate the combined output signal to generate the digital quantity representing a net amount of charge that has flowed through the impedance.

6. The signal processing system of claim 4, wherein the digital quantity represents a net amount of charge that has been delivered from a battery coupled to the impedance.

7. The signal processing system of claim 1, wherein the sensor readout channel further comprises a digital accumulator configured to digitally integrate the combined output signal to generate an accumulated combined output signal.

8. The signal processing system of claim 1, wherein the sensor readout channel further comprises a digital accumulator configured to digitally integrate the modulator output signal to generate an accumulated modulator output signal, and the combiner is configured to combine the accumulated modulator output signal with the auxiliary path output signal to generate the combined output signal.

9. The signal processing system of claim 1, further comprising an anti-aliasing filter coupled between an input for receiving the electronic signal and the modulator input.

10. The signal processing system of claim 9, wherein the anti-aliasing filter is located in a path of the sensor readout channel between the first outside chopping switches and the second outside chopping switches.

11. The signal processing system of claim 9, wherein the first outside chopping switches are located in a path of the sensor readout channel between the input for receiving the electronic signal and the anti-aliasing filter.

12. The signal processing system of claim 1, further comprising an adaptive gain element applied to the auxiliary path output in order to minimize signal-to-noise degradation due to non-idealities of analog components of the signal processing system.

13. The signal processing system of claim 1, wherein the sigma-delta modulator comprises a 3-level quantizer.

14. The signal processing system of claim 13, wherein the 3-level quantizer is configured to, during production test of the signal processing system, detect the combined output signal in response to a pilot signal injected into an input of the signal processing system to determine a threshold mismatch of the 3-level quantizer.

15. The signal processing system of claim 1, wherein the auxiliary signal path is configured such that it is only enabled upon a readout request for the combined output signal.

16. A method comprising, in a signal processing system comprising a sensor readout channel configured to convert an electronic signal into a digital quantity, the sensor readout channel comprising a first-order sigma-delta modulator having a modulator input and a modulator output:
switching first outside chopping switches located at the modulator input and second outside chopping switches located at the modulator output in synchronization;
receiving, by an auxiliary path comprising an analog-to-digital converter (ADC) having an auxiliary path input and an auxiliary path output, as its input signal a signal output by a memory element of the first-order sigma-delta modulator; and
combining a modulator output signal generated by the first-order sigma-delta modulator with an auxiliary path output signal generated by the auxiliary path to generate a combined output signal.

17. The method of claim 16, wherein the memory element comprises an integrator.

18. The method of claim 16, further comprising converting a sensed physical quantity into the electronic signal with an impedance.

19. The method of claim 18, wherein:
the electronic signal is a voltage; and
the impedance is a resistor configured to convert an electrical current into the voltage.

20. The method of claim 19, further comprising digitally integrating, with a digital accumulator integral to the sensor readout channel, the combined output signal to generate the digital quantity representing a net amount of charge that has flowed through the impedance.

21. The method of claim 19, wherein the digital quantity represents a net amount of charge that has been delivered from a battery coupled to the impedance.

22. The method of claim 16, further comprising digitally integrating, with a digital accumulator integral to the sensor readout channel, the combined output signal to generate an accumulated combined output signal.

23. The method of claim 16, further comprising:
digitally integrating, with a digital accumulator integral to the sensor readout channel, the modulator output signal to generate an accumulated modulator output signal; and
combining the accumulated modulator output signal with the auxiliary path output signal to generate the combined output signal.

24. The method of claim 16, further comprising an anti-aliasing filter coupled between an input for receiving the electronic signal and the modulator input.

25. The method of claim 24, wherein the anti-aliasing filter is located in a path of the sensor readout channel between the first outside chopping switches and the second outside chopping switches.

26. The method of claim 24, wherein the first outside chopping switches are located in a path of the sensor readout channel between the input for receiving the electronic signal and the anti-aliasing filter.

27. The method of claim 16, further comprising applying an adaptive gain element to the auxiliary path output in order to minimize signal-to-noise degradation due to non-idealities of analog components of the signal processing system.

28. The method of claim 16, wherein the sigma-delta modulator comprises a 3-level quantizer.

29. The method of claim 28, further comprising, during production test of the signal processing system, detecting the combined output signal in response to a pilot signal injected into an input of the signal processing system to determine a threshold mismatch of the 3-level quantizer.

30. The method of claim 16, enabling the auxiliary signal path only upon a readout request for the combined output signal.

* * * * *